(12) United States Patent
Morika et al.

(10) Patent No.: US 11,757,325 B2
(45) Date of Patent: Sep. 12, 2023

(54) MOTOR DEVICE

(71) Applicant: SUBARU CORPORATION, Tokyo (JP)

(72) Inventors: Hiroki Morika, Tokyo (JP); Yutaka Iino, Tokyo (JP); Yasufumi Tanaka, Tokyo (JP); Hayata Mimatsu, Tokyo (JP)

(73) Assignee: SUBARU CORPORATION, Tokyo (JP)

( * ) Notice: Subject to any disclaimer, the term of this patent is extended or adjusted under 35 U.S.C. 154(b) by 168 days.

(21) Appl. No.: 16/996,560

(22) Filed: Aug. 18, 2020

(65) Prior Publication Data

US 2021/0066991 A1    Mar. 4, 2021

(30) Foreign Application Priority Data

Aug. 27, 2019  (JP) .................................. 2019-154229

(51) Int. Cl.
| | |
|---|---|
| *H02K 5/20* | (2006.01) |
| *H05K 7/20* | (2006.01) |
| *H02K 5/22* | (2006.01) |
| *H02M 7/537* | (2006.01) |
| *H02M 7/00* | (2006.01) |
| *H02K 9/19* | (2006.01) |

(52) U.S. Cl.
CPC ............. *H02K 5/20* (2013.01); *H02K 5/225* (2013.01); *H02K 9/19* (2013.01); *H02M 7/003* (2013.01); *H02M 7/537* (2013.01); *H05K 7/20927* (2013.01)

(58) Field of Classification Search
CPC ...... H05K 7/20927; H05K 7/14; H02K 5/225; H02K 5/203; H02K 5/20; H02K 5/10; H02K 9/19; H02K 11/33; H02K 11/0094; H02M 7/003
See application file for complete search history.

(56) References Cited

U.S. PATENT DOCUMENTS

| | | | |
|---|---|---|---|
| 2010/0013331 A1 | 1/2010 | Yoshida et al. | |
| 2016/0056683 A1* | 2/2016 | Nakanishi | H02K 5/20 |
| | | | 310/54 |
| 2016/0327316 A1* | 11/2016 | Hattori | H02K 5/225 |
| 2018/0269749 A1* | 9/2018 | Gu | H02K 9/18 |

FOREIGN PATENT DOCUMENTS

| | | |
|---|---|---|
| JP | 2008-131672 A | 6/2008 |
| JP | 2012-64724 A | 3/2012 |

* cited by examiner

*Primary Examiner* — Bryan R Perez
(74) *Attorney, Agent, or Firm* — TROUTMAN PEPPER HAMILTON SANDERS LLP

(57) ABSTRACT

A motor device includes a motor case, an inverter case, a motor, an inverter, and a terminal block. The inverter case is attached to the motor case. The motor is disposed in the motor case. The inverter is disposed in the inverter case. The terminal block is disposed in the inverter case and has a terminal block channel. The terminal block is coupled to an energizing member that extends from the motor. The terminal block channel is configured to guide a coolant.

7 Claims, 4 Drawing Sheets

MOTOR DEVICE

CROSS-REFERENCE TO RELATED APPLICATIONS

The present application claims priority from Japanese Patent Application No. 2019-154229 filed on Aug. 27, 2019, the entire contents of which are hereby incorporated by reference.

BACKGROUND

The technology relates to a motor device including a motor and an inverter.

Examples of a motor device including a motor and an inverter include a motor device such as an electric axle that drives wheels. In such a motor device, an inverter case accommodating an inverter is attached to a motor case accommodating a motor (for example, reference is made to Japanese Unexamined Patent Application Publication (JP-A) Nos. 2008-131672 and 2012-64724).

SUMMARY

An aspect of the technology provides a motor device including a motor case, an inverter case, a motor, an inverter, and a terminal block. The inverter case is attached to the motor case. The motor is disposed in the motor case. The inverter is disposed in the inverter case. The terminal block is disposed in the inverter case and has a terminal block channel. The terminal block is coupled to an energizing member that extends from the motor. The terminal block channel is configured to guide a coolant.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the technology.

DETAILED DESCRIPTION

Figure 1:
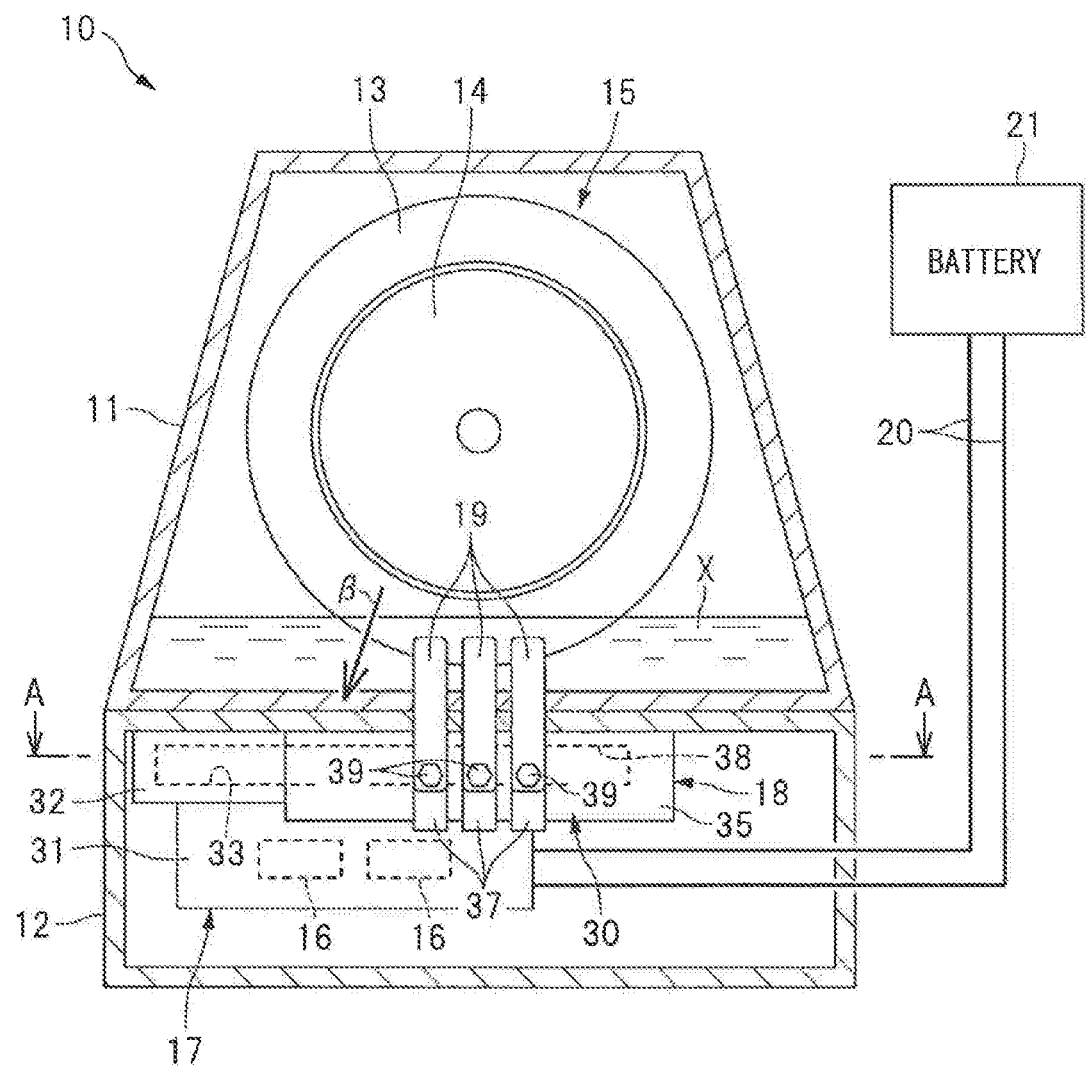
FIG. 1 is a schematic diagram illustrating a motor device according to one example embodiment of the technology.

In operating a motor device, it is necessary to appropriately cool an inverter that includes an IGBT, for example. Therefore, the motor device described in JP-A No. 2008-131672 includes a cooling channel that is provided near the IGBT, for example, to actively cool the inverter. If the motor device is driven, however, heat generated by the motor is transferred to the inverter, which can cause a temperature of the inverter to greatly increase. For example, in a motor device in which an inverter case is attached to a motor case, an inverter is disposed near a motor, which makes it difficult to reduce an increase in temperature of the inverter.

It is desirable to appropriately cool an inverter of a motor device.

In the following, some example embodiments of the technology are described with reference to the accompanying drawings. Note that the following description is directed to illustrative examples of the disclosure and not to be construed as limiting to the technology. In each of the drawings referred to in the following description, elements have different scales in order to illustrate the respective elements with sizes recognizable in the drawings. Therefore, factors including, without limitation, the number of each of the elements, the shape of each of the elements, a size of each of the elements, a ratio between the elements, and relative positional relationship between the elements are illustrative only and not to be construed as limiting to the technology. Further, elements in the following example embodiments which are not recited in a most-generic independent claim of the disclosure are optional and may be provided on an as-needed basis. Throughout the present specification and the drawings, elements having substantially the same function and configuration are denoted with the same numerals to avoid any redundant description.

[Motor Device]

FIG. 1 is a schematic diagram illustrating a motor device 10 according to an example embodiment of the technology. The illustrated motor device 10 may be used as, for example, an electric axle that drives wheels of a vehicle such as an automobile.

As illustrated in FIG. 1, the motor device 10 includes a motor case 11, and an inverter case 12 that is attached to the motor case 11. The motor case 11 accommodates a motor 15 that includes a stator 13 and a rotor 14. The inverter case 12 accommodates an inverter 17 that includes switching devices 16 and one or more capacitors, for example. The inverter case 12 also accommodates a terminal block 18 that is electrically coupled to the inverter 17. Furthermore, to the terminal block 18 accommodated in the inverter case 12 are coupled three busbars 19 extending from the stator 13. In other words, the motor 15 and the inverter 17 may be electrically coupled to each other via the terminal block 18 and the three busbars 19. It is to be noted that the motor 15 may be a three-phase alternating current motor, such as a synchronous motor or an induction motor, and the busbars 19 may be coupled to field coils of the respective phases (U phase, V phase, and W phase) of the motor through the terminal block 18. In one embodiment, the busbar 19 may serve as an "energizing member".

To the inverter 17 in the inverter case 12 may be coupled a battery 21, such as a lithium ion battery, via an energizing cable 20. The inverter 17 serving as an electric power converter may be configured to convert electric power between direct current electric power and alternating current electric power. In a case of controlling the motor 15 to a powering state, direct current electric power may be converted to alternating current electric power via the inverter 17 by driving the switching devices 16, such as insulated gate bipolar transistors (IGBTs). Electric power may thus be supplied from the battery 21 to the motor 15 through the inverter 17. In a case of controlling the motor 15 to a regenerative state, alternating current electric power may be converted to direct current electric power via the inverter 17 by driving the switching devices 16. Electric power may thus be supplied from the motor 15 to the battery 21 through the inverter 17.

[Cooling System]

Figure 2:
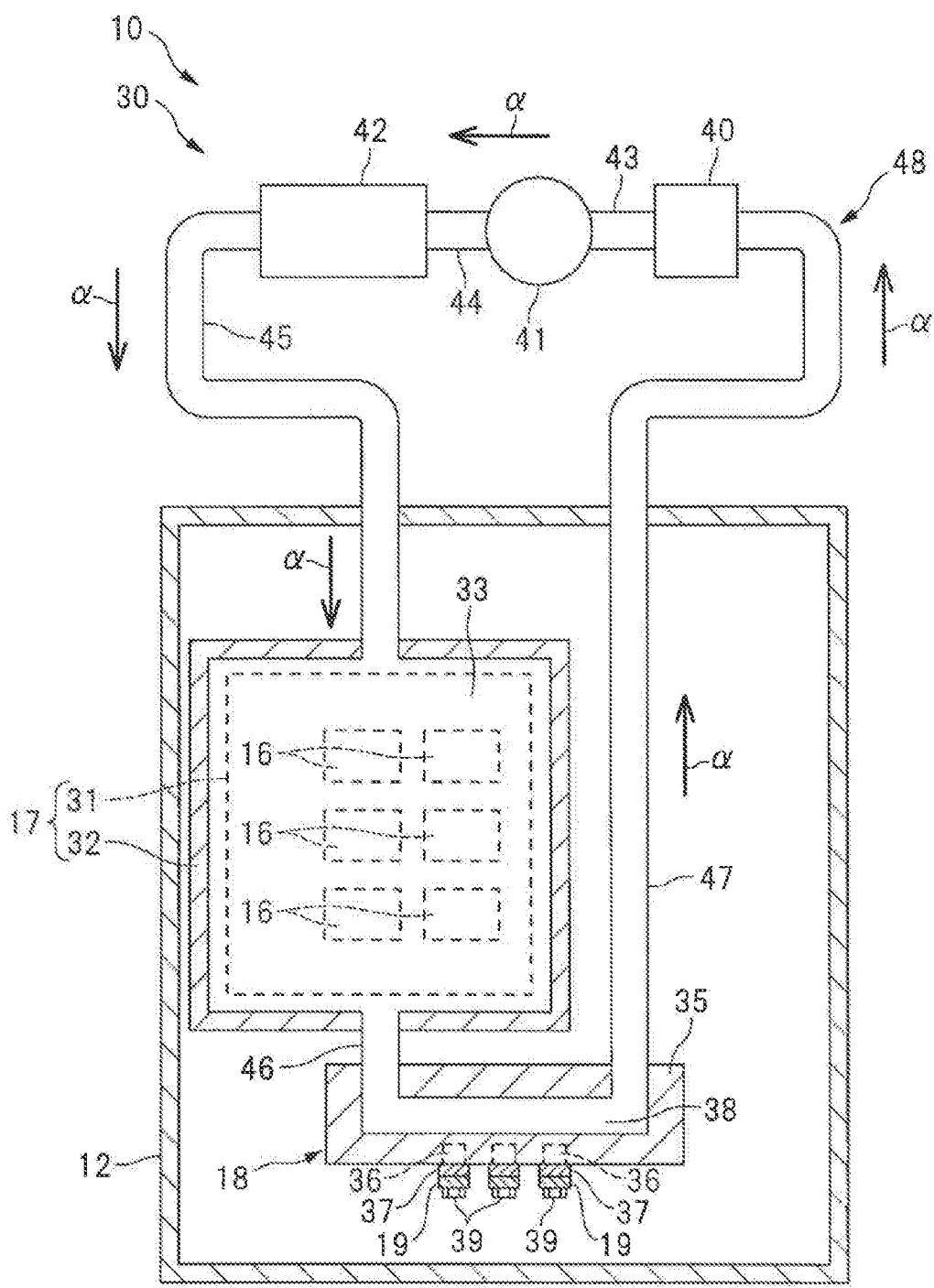
FIG. 2 is a cross-sectional diagram taken along line A-A in FIG. 1.

Now, a cooling system 30 provided in the motor device 10 will be described. FIG. 2 is a cross-sectional diagram taken along line A-A in FIG. 1. As illustrated in FIG. 2, the motor device 10 may be provided with the cooling system 30 that cools the inverter 17.

As illustrated in FIG. 1 and FIG. 2, the inverter 17 in the inverter case 12 may include a circuit board 31 provided with the switching devices 16, for example, and a cooling plate 32 joined to the circuit board 31. The cooling plate 32 configuring the inverter 17 may be provided with a first water jacket 33 that guides a coolant. The terminal block 18 in the inverter case 12 may include a main body 35, nut members 36, and connection terminals 37. The main body 35 may include an insulating resin such as polyethylene. The nut members 36 may be provided in the main body 35. The connection terminals 37 may be provided on a surface of the main body 35. The main body 35 configuring the terminal block 18 may be provided with a second water jacket 38 that guides the coolant. To the nut members 36 of the terminal block 18 may be fastened bolt members 39 to couple the busbars 19 to the respective connection terminals 37 of the terminal block 18. In one embodiment, the first water jacket 33 may serve as an "inverter channel". In one embodiment, the second water jacket 38 may serve as a "terminal block channel".

As illustrated in FIG. 2, the cooling system 30 may include a reservoir tank 40, a cooling pump 41, a radiator 42, the first water jacket 33 of the inverter 17, and the second water jacket 38 of the terminal block 18. The reservoir tank 40 may store the coolant. The cooling pump 41 may cause the coolant to circulate. The radiator 42 may cause the coolant to dissipate heat. The reservoir tank 40, the cooling pump 41, the radiator 42, and the water jackets 33 and 38 may be coupled in series with the use of pipes 43 to 47. In other words, the cooling system 30 may be provided with a cooling circuit 48 that includes the reservoir tank 40, the cooling pump 41, the radiator 42, the water jackets 33 and 38, and the pipes 43 to 47. In one embodiment, the radiator 42 may serve as a "heat dissipator".

The cooling pump 41 may be driven by an electric motor, for example, that is not illustrated. The coolant may thus be sucked from the reservoir tank 40 into the cooling pump 41, and discharged from the cooling pump 41 toward the radiator 42. The coolant cooled by passing through the radiator 42 may be supplied to the first water jacket 33 to cool the inverter 17, supplied to the second water jacket 38 to cool the terminal block 18, and thereafter guided to the reservoir tank 40. This enables the coolant to circulate along the cooling circuit 48, as indicated by an arrow a, making it possible to cool the inverter 17 and the terminal block 18 continuously. It is to be noted that the motor case 11 may store lubricant oil X, and the lubricant oil X may cool the stator 13 of the motor 15.

[Cooling of Inverter]

As described above, the motor case 11 and the inverter case 12 are attached to each other. In the motor device 10 including the thus integrated motor case 11 and inverter case 12, the inverter 17 may be disposed near the motor 15, which makes it easier for heat to transfer from the motor 15 to the inverter 17. Moreover, the motor 15 and the inverter 17 may be coupled to each other via the busbars 19 each including a metal plate. Thus providing the busbars 19 having high thermal conductivity between the motor 15 and the inverter 17 causes much heat to transfer from the motor 15 to the inverter 17.

Hence, as illustrated in FIG. 2, the terminal block 18 to which the busbars 19 are coupled is provided with the second water jacket 38 that guides the coolant. The coolant may thus flow through the terminal block 18 to cool the terminal block 18, thereby cooling the busbars 19 coupled to the terminal block 18, making it possible to reduce heat that transfers to the inverter 17 through the busbars 19. This makes it possible to reduce an increase in temperature of the inverter 17, which helps to cool the inverter 17 efficiently.

In addition, as illustrated in FIG. 2, the radiator 42 may be coupled, via the pipe 45, to the upstream side of the first water jacket 33 provided in the inverter 17, whereas the second water jacket 38 of the terminal block 18 may be coupled, via the pipe 46, to the downstream side of the first water jacket 33. In other words, the coolant cooled by passing through the radiator 42 may flow through the first water jacket 33 of the inverter 17, and thereafter flow through the second water jacket 38 of the terminal block 18. Thus causing the coolant to flow through the inverter 17 before through the terminal block 18 makes it possible to guide the coolant with low temperature to the inverter 17, which helps to cool the inverter 17 more appropriately.

Furthermore, as illustrated in FIG. 1, the first water jacket 33 of the inverter 17 may be positioned between the switching devices 16 and the motor 15. In other words, the switching devices 16 and the motor 15 that is opposed to the switching devices 16 may be isolated from each other by a layer of the coolant flowing through the first water jacket 33. This enables the coolant to absorb electromagnetic waves directed from the motor 15 toward the switching devices 16, as indicated by an arrow 13 in FIG. 1, making it possible to reduce radiant heat (radiation heat) caused in the switching devices 16. This makes it possible to reduce an increase in temperature of the switching devices 16, which helps to cool the inverter 17 appropriately. In addition, as illustrated in FIG. 1, the first water jacket 33 of the inverter 17 may be disposed closer to the middle of the motor device 10, which makes it possible to prevent damage to the first water jacket 33 due to scattering stones, for example.

Other Embodiments

Figure 3:
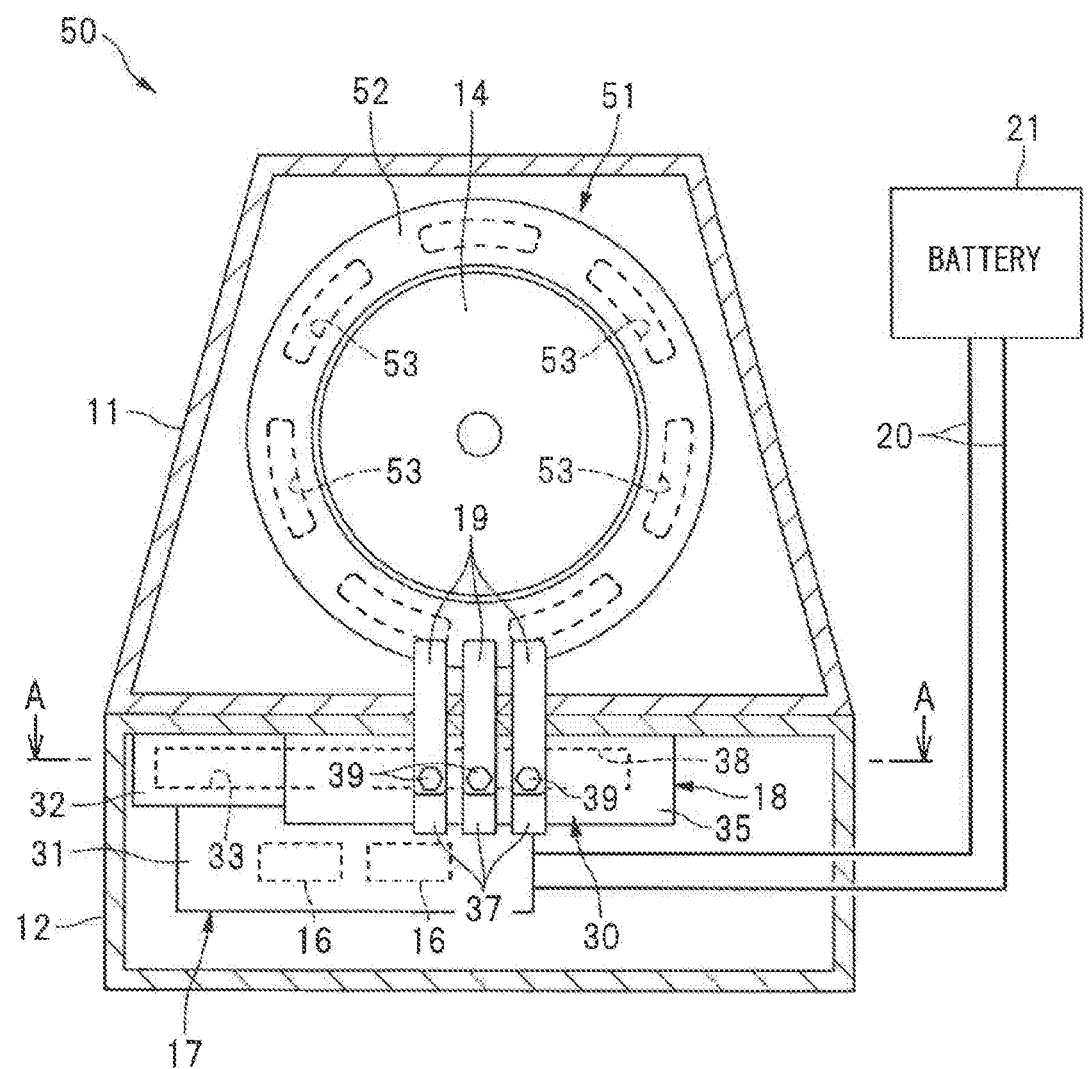
FIG. 3 is a schematic diagram illustrating a motor device according to one example embodiment of the technology.
Figure 4:
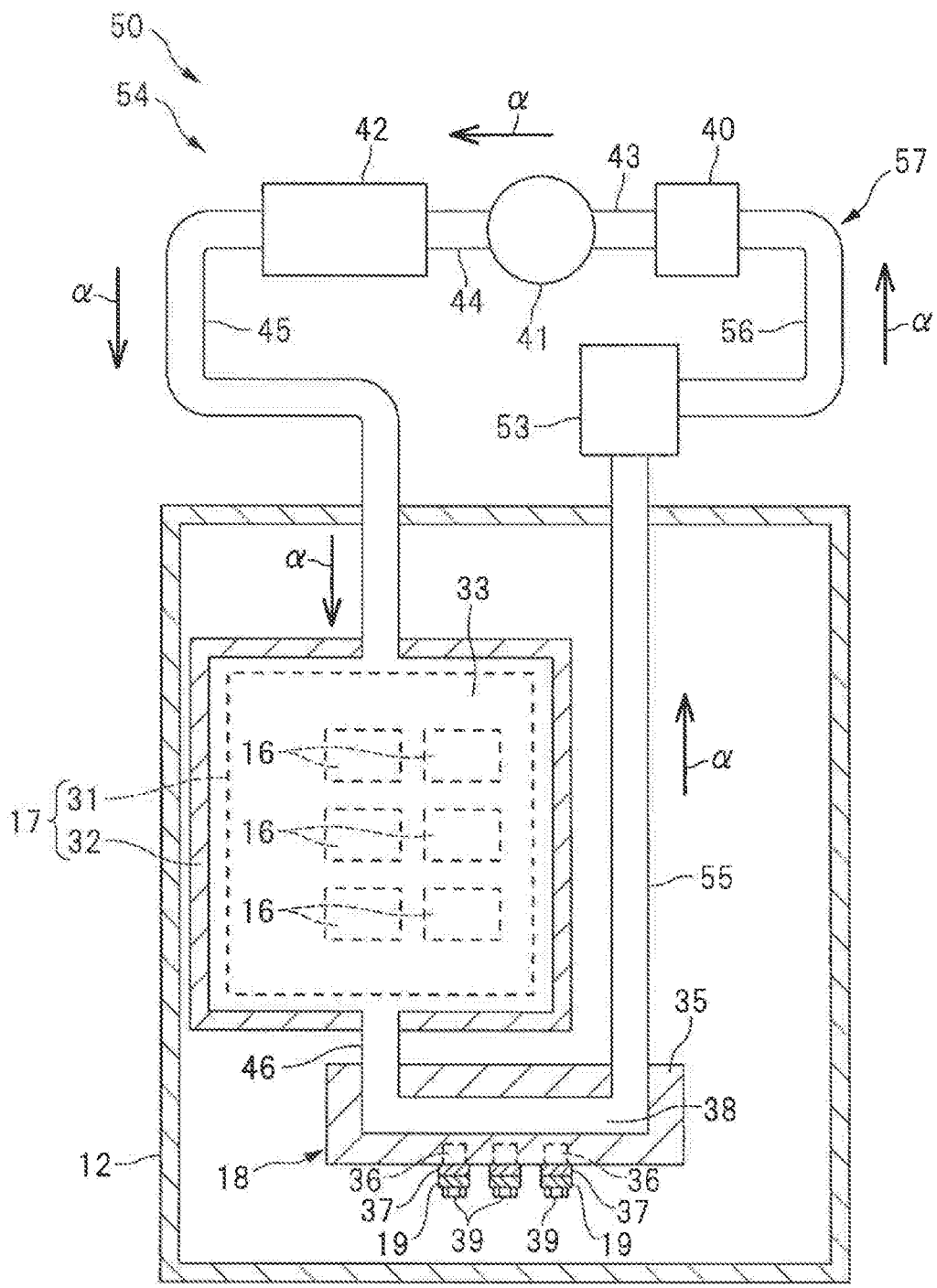
FIG. 4 is a cross-sectional diagram taken along line A-A in FIG. 3.

In the above description, the lubricant oil X may be stored in the motor case 11 to cool the motor 15. However, without being limited thereto, the motor 15 may be cooled by using the cooling system 30 described above. FIG. 3 is a schematic diagram illustrating a motor device 50 according to another example embodiment of the technology. FIG. 4 is a cross-sectional diagram taken along line A-A in FIG. 3. It is to be noted that, in FIG. 3 and FIG. 4, parts and regions that are similar to parts and regions illustrated in FIG. 1 and FIG. 2 may be denoted with the same numerals to avoid redundant description thereof.

As illustrated in FIG. 3, the motor device 50 may be provided with a motor 51, and a stator 52 of the motor 51 may be provided with third water jackets 53. As illustrated in FIG. 4, a cooling system 54 provided in the motor device 50 may include the reservoir tank 40, the cooling pump 41, the radiator 42, and the water jackets 33, 38, and 53. The reservoir tank 40, the cooling pump 41, the radiator 42, and the water jackets 33, 38, and 53 may be coupled in series with the use of pipes 43 to 46, 55, and 56. In other words, the cooling system 54 may be provided with a cooling circuit 57 that includes the reservoir tank 40, the cooling pump 41, the radiator 42, the water jackets 33, 38, and 53, and the pipes 43 to 46, 55, and 56.

The cooling pump 41 of the cooling system 54 may be driven, and the coolant may thus be sucked from the reservoir tank 40 into the cooling pump 41, and discharged from the cooling pump 41 toward the radiator 42. The coolant cooled by passing through the radiator 42 may be supplied to the first water jacket 33 to cool the inverter 17, supplied to the second water jacket 38 to cool the terminal block 18, supplied to the third water jackets 53 to cool the motor 51, and thereafter guided to the reservoir tank 40. This enables the coolant to circulate along the cooling circuit 57, as indicated by an arrow a, making it possible to cool the inverter 17, the terminal block 18, and the motor 51 continuously.

This motor device 50 is also able to provide example effects similar to those of the motor device 10 described above. In other words, the coolant may flow through the terminal block 18 to cool the terminal block 18, thereby cooling the busbars 19 coupled to the terminal block 18, making it possible to reduce heat that transfers to the inverter 17 through the busbars 19. This makes it possible to reduce an increase in temperature of the inverter 17, which helps to cool the inverter 17 efficiently.

The technology is not limited to the example embodiments, and various modifications may be made without departing from the scope of the technology. The above description exemplifies IGBTs, which are semiconductor devices, as the switching devices 16 provided in the inverter 17. However, without being limited thereto, the switching devices 16 may be other semiconductor devices, such as MOSFETs. Moreover, in the above description, the busbars 19 each including a metal plate may be used as energizing members extending from the motors 15 and 51. However, without being limited thereto, the energizing members may be electric wires, such as cables. It is to be noted that the coolant to be injected into the cooling system 30 or 54 may be an antifreeze for a water-cooled engine, for example.

In the above description, the motors 15 and 51 may be cooled by the lubricant oil X or the coolant. However, without being limited thereto, the motors 15 and 51 may be cooled by air. In other words, the motors 15 and 51 may be cooled by any of oil cooling, water cooling, and air cooling. In the illustrated example, the cooling pump 41 may be provided on the upstream side of the radiator 42. However, without being limited thereto, the cooling pump 41 may be provided on the downstream side of the radiator 42. In the illustrated example, the motor case 11 and the inverter case 12 may be arranged vertically. However, without being limited thereto, the motor case 11 and the inverter case 12 may be arranged laterally. It is to be noted that shapes of the motor case 11 and the inverter case 12 are not limited to the illustrated shapes, and the cases may have other shapes.

According to at least one embodiment of the technology, a terminal block coupled to an energizing member that extends from a motor has a terminal block channel that guides a coolant. This makes it possible to appropriately cool an inverter of a motor device.

Although some example embodiments and modification examples of the technology are described hereinabove, the foregoing embodiments and modification examples are mere examples and are not intended to limit the scope of the technology. It should be also appreciated that various omissions, replacements, and modifications may be made in the foregoing embodiments and modification examples described herein, without departing from the scope of the technology. The technology is intended to include such modifications and alterations in so far as they fall within the scope of the appended claims or the equivalents thereof.

The invention claimed is:

1. A motor device comprising:
a motor case;
an inverter case attached to the motor case;
a motor disposed in the motor case;
an inverter disposed in the inverter case, and joined to a cooling plate provided with a first water jacket configured to guide a coolant in the cooling plate to cool the inverter; and
a terminal block disposed in the inverter case, and configured to fix a busbar that extends from the motor and that electrically connects the motor with the inverter to supply an electric power from the inverter to the motor, wherein
the terminal block has a path through which water circulates inside the terminal block, and the path is provided with a second water jacket other than the first water jacket, the second water jacket configured to guide the coolant in the terminal block to cool the terminal block.

2. The motor device according to claim 1, wherein
the inverter has an inverter channel configured to guide the coolant,
a heat dissipator is coupled upstream of the inverter channel, and
a terminal block channel is coupled downstream of the inverter channel.

3. The motor device according to claim 2, wherein
the inverter includes a switching device, and
the inverter channel is positioned between the switching device and the motor.

4. The motor device according to claim 3, wherein the busbar is a metal plate.

5. The motor device according to claim 2, wherein the busbar is a metal plate.

6. The motor device according to claim 1, wherein the busbar is a metal plate.

7. A case for a motor device, the case comprising:
a motor case configured to dispose the motor in the motor case;
an inverter case configured to dispose an inverter in the inverter case, and including a cooling plate configured to be joined with the inverter and provided with a first water jacket configured to guide a coolant into the cooling plate to cool the inverter; and
a terminal block disposed in the inverter case, and configured to fix a busbar that extends from the motor and that electrically connects the motor with the inverter to supply an electric power from the inverter to the motor, wherein
the terminal block has a path through which water circulates inside the terminal block, and the path is provided with a second water jacket other than the first water jacket, the second water jacket configured to guide the coolant into the terminal block to cool the terminal block.

* * * * *